United States Patent [19]

Wakimoto

[11] Patent Number: 5,212,483
[45] Date of Patent: May 18, 1993

[54] MULTIPLEXING A/D CONVERTER HAVING SWEEP INTERRUPT FUNCTION

[75] Inventor: Akihiko Wakimoto, Hyogo, Japan

[73] Assignee: Mitsubishi Denki Kabushiki Kaisha, Tokyo, Japan

[21] Appl. No.: 734,410

[22] Filed: Jul. 23, 1991

[30] Foreign Application Priority Data

Oct. 17, 1990 [JP] Japan .................................. 2-278061

[51] Int. Cl.$^5$ ............................................. H03M 1/12
[52] U.S. Cl. ..................................... 341/141; 341/155
[58] Field of Search ............................... 341/141, 155

[56] References Cited

U.S. PATENT DOCUMENTS

| 4,654,632 | 3/1987 | Yoshida et al. | 341/141 |
| 4,742,515 | 5/1988 | Dabholker et al. | 341/141 |
| 4,933,676 | 6/1990 | Hauge et al. | 341/141 |

OTHER PUBLICATIONS

Short, Kenneth L., "Microprocessors and Programmed Logic", Prentice-Hall, Englewood Cliffs, N.J., 1981, pp. 294-297.

*Primary Examiner*—Marc Hoff
*Attorney, Agent, or Firm*—Townsend and Townsend

[57] ABSTRACT

An A/D converter comprising a plurality of inputs, an input selection array to select one of the input signals, an A/D circuit providing a digital output and a conversion completion signal, a counter for sweeping a contiguous subset of the input channels sequentially, the counter incrementing once each time the conversion completion signal is asserted and resetting to point to the first channel in the subset after reaching the last channel in the subset, a channel memory for storing the value of the counter while an optional channel is selected for conversion without regard to the present position of the sweeping counter, a return bus, activated by the conversion completion signal, for replacing the value of the counter after the optional conversion is complete and returning to the normal sweep sequence in the previous position in the sequence, thereby avoiding useless conversion operations.

1 Claim, 4 Drawing Sheets

MULTIPLEXING A/D CONVERTER HAVING SWEEP INTERRUPT FUNCTION

BACKGROUND OF THE INVENTION

1. Field of the Invention

The present invention relates to an A/D converter, and more particularly to a sweep function in the A/D converter having a plurality of input channels.

2. Description of Prior Art

FIG. 3 is a block diagram showing a configuration of a microcomputer. In the Figure, numeral 100 indicates a one-chip microcomputer configured with semiconductor integrated circuit, numeral 101 indicates a CPU, numeral 102 indicates a memory, numeral 103 indicates an A/D converter for converting an analog signal into a digital signal, and numeral 104 indicates a bus which connects those members to each other. The A/D converter 103 has functions to select a predetermined optional signal from among analog signals to be inputted from a plurality of A/D conversion input terminals 105 provided in the microcomputer 100, and to convert the analog signal into a digital signal. The A/D converter further has a sweep function for selecting automatically and repeatedly an input terminal in a predetermined range among the A/D conversion input terminals 105 by shifting succeedingly, so as to carry out an A/D conversion (this operating mode is called as "sweep mode").

FIG. 4 is a block diagram showing a conventional example of the A/D converter configured as the above description. In the Figure, numeral 1 represents an A/D converter in which, for example, A/D conversion input terminals of 8 channels from channel 0 through channel 7 are selected at switches S0 through S7, and a selected channel is to be connected to the A/D converter 1. A channel selector 3 decides which is to be selected from among the switches S0 through S7. A result converted at the A/D converter 1 is stored in a register corresponding to a converted channel of a converted result storing register 2, and is read out by a CPU or the like. The channel selector 3 determines which switches among the switches S0 through S7 is to be turned on with a value designated by each channel setting bit (3 bits in this example) in a channel setting register 4. A channel setting determining circuit 5 can detect which channels among the channels to be converted from analog to digital is being converted dependent on each bit output of the channel setting register 4. Particularly, when the circuit is used at the sweep mode and a channel being converted reaches a designated channel and when an A/D conversion completion signal 1a is inputted, a channel setting bit initialization signal 5a is generated and a channel setting bit in the channel setting register 4 is initialized. The channel setting register 4 functions as a binary counter at the sweep mode, and data can be set optionally with input setting data d0, d1, d2 and can designate optionally which channel is to be converted from analog signal to digital signal.

Next, the operation of the device shown in FIG. 4 will be explained.

In the sweep mode, channels in a predetermined range among the channels 0 to 7 of the A/D conversion input channel are converted sequentially and this operation is repeated. For example, if the channels 0 through 3 are set as in the sweep mode, A/D conversions of 4 channels 0 to 3 are repeated. Since the start channel is always channel 0, the channel 0 is designated at first by channel setting bit in the channel setting register 4, and the channel selector 3 makes the switch S0 turn on, so that an analog signal from the channel 0 is inputted into the A/D converter 1. The result converted at the A/D converter 1 is stored in a register corresponding to the channel 0 in the converted result storing register 2. When the storing is finished and the conversion is completed, a channel setting bit in the channel setting register 4 designates the channel 1, turning on the switch S1 by the channel selector 3, so that an analog signal from the channel 1 is converted into a digital signal and is stored in the converted result storing register 2. This operation is repeated, and when the conversion of the channel 3 is completed, the setting of the channel 3 is detected by the channel setting determining circuit 5 since the sweep mode for the channels 0 to 3 had been previously selected. When an A/D conversion completion signal 1a is inputted, a channel setting bit initialization signal 5a is generated and the channel setting bit in the channel setting register 4 is initialized so as to designate the channel 0. In this manner, channel selection returns from the channel 3 to the channel 0 so as to perform repeatedly the A/D conversion of the 4 channels from 0 to 3.

The conventional A/D converter having a sweeping function is constructed as the above-mentioned description. In this converter, when a channel which had not been selected for the sweep mode is to be converted during sweeping operation, it was necessary that the sweep mode is shifted to another mode so as to select a desired channel for A/D conversion. When the mode is returned to the sweep mode, the conversion always begins from the channel 0 in the sweep mode, and since the channels which had been converted before the shift of the mode are to be converted once again, the converted results obtained before the shift of the mode can not be utilized, thereby useless operations are inevitable during the conversion.

SUMMARY OF THE INVENTION

An object of the present invention, in view of the above-mentioned problem, is to provide an A/D converter in which an optional channel can be set to perform the A/D conversion during sweeping operation, and when the conversion is completed, the mode returns to the sweep mode to perform the conversion starting from the channel which had been interrupted, thereby eliminating useless operations during the conversion.

The A/D converter according to the present invention comprises saving means for saving in memory means the then set value in channel setting means at setting an optional channel during sweep operation, detecting means for outputting a set channel conversion completion signal when a conversion completion of the optional channel which had been set at this time is detected, and returning means for returning the set value being saved in the memory means to the channel setting means in accordance with the set channel conversion completion signal.

That is, in the A/D converter according to the present invention, when a channel which is not selected in the sweep mode during sweeping operation is set, a setting value of a channel which is under sweeping operation is saved temporarily in memory means such as register and the like so as to set a desired channel. Further, when the conversion of a channel which is set during sweeping operation is completed, the channel which had been under conversion during sweep operation and had been saved temporarily is returned and the sweep mode operation will be continued starting from this channel. Thus, since the channel which is under sweeping can be saved temporarily, a channel which is not selected in the sweep mode can be set to convert easily even during sweeping operation, thereby utilizing the provided function effectively. In addition, when the conversion of the channel is completed, the mode returns to the sweep mode so as to re-start the conversion from the channel which was under sweeping operation and was saved temporarily, so that the converted results obtained in the sweep mode can be utilized effectively.

The above and other objects, features, and advantages of the invention will become more apparent from the following description when taken in conjunction with the accompanying drawings.

DESCRIPTION OF THE PREFERRED EMBODIMENT

Figure 1:
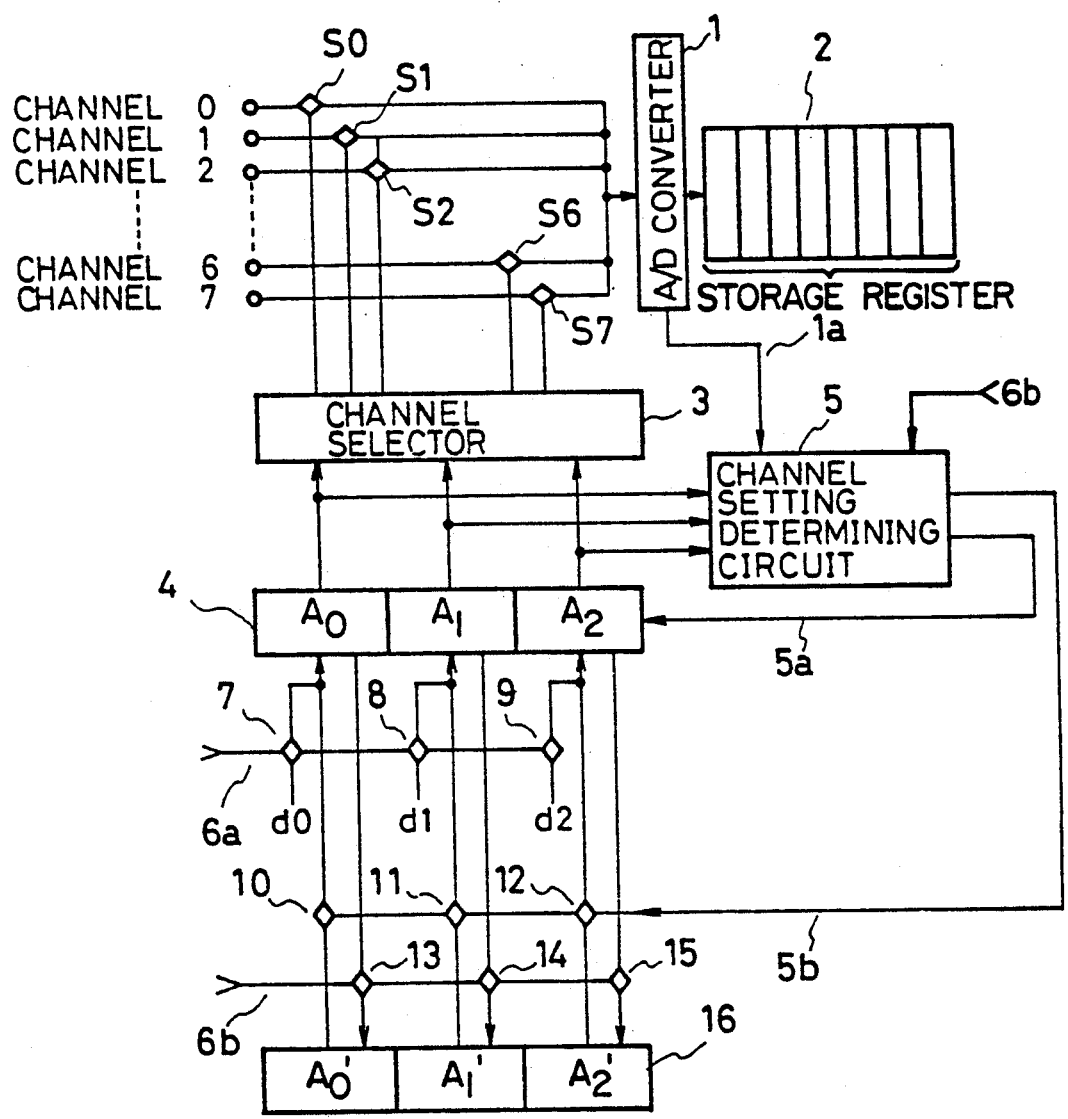
FIG. 1 is a block diagram showing an A/D converter according to an embodiment of the present invention.

An embodiment of the present invention will be explained hereinafter referring to the drawings.

FIG. 1 is a block diagram showing an A/D converter in the embodiment. In the Figure, numeral 1 indicates an A/D converter to which analog signals from channels selected by switches S0 through S7 from among channels 0 through 7. Results converted at the A/D converter 1 are stored in a converted result storing register 2 in positions corresponding to the channels. The switches S0 through S7 are selected by a channel selector 3. Channel setting bit information which is set in a channel setting register 4 is inputted to the channel selector 3. At the same time, the information is inputted also into a channel setting determining circuit 5 so that a channel which is under conversion can be detected. When the conversion of a range to be converted in the sweep mode is over, the channel setting determining circuit 5 produces a channel setting bit initialization signal 5a for initializing the channel setting bit so as to repeat the conversion, and the channel setting register 4 is initialized. The channel setting register 4 can set optionally the values of d0, d1, and d2 through the switches 7, 8, and 9 which are turned on or off by a channel setting signal (0) 6a. The channel setting register 4 is connected to a sweep channel saving register 16 whose bits correspond to bits of the register 4, through switches 13, 14, and 15 which are turned on or off by a channel setting signal (1) 6b. Further, the channel setting register 4 is connected to the sweep channel saving register 16 through switches 10, 11, and 12 so as to make the bits of the two registers correspond to each other. The switches 10, 11, and 12 are turned on or off by a setting channel conversion completion signal 5b outputted from the channel setting determining circuit 5 upon completion of A/D conversion of the channels established separately at the time of sweeping. Here, the channel setting register 4 is channel setting means, the sweep channel saving register 16 is memory means, the switches 13, 14, 15 are saving means, and the switches 10, 11, 12 are returning means.

Figure 2:
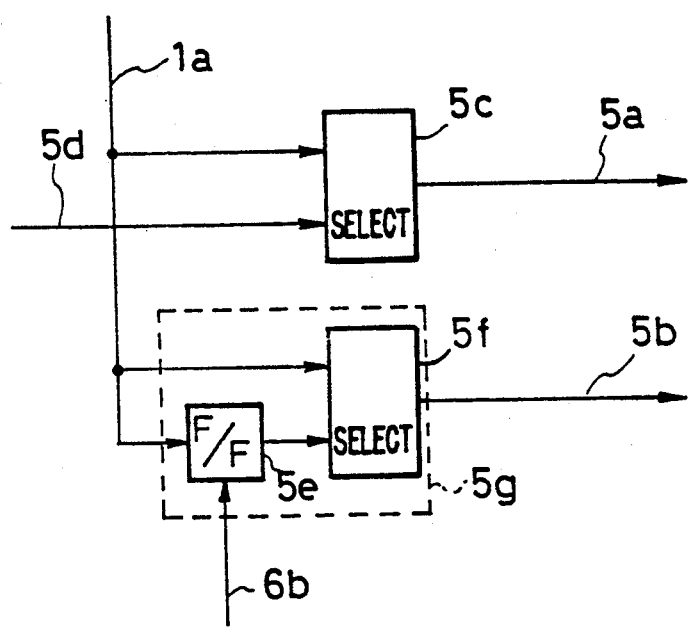
FIG. 2 is a block diagram showing the configuration of a main part of a channel setting determining circuit in the embodiment.
Figure 3:
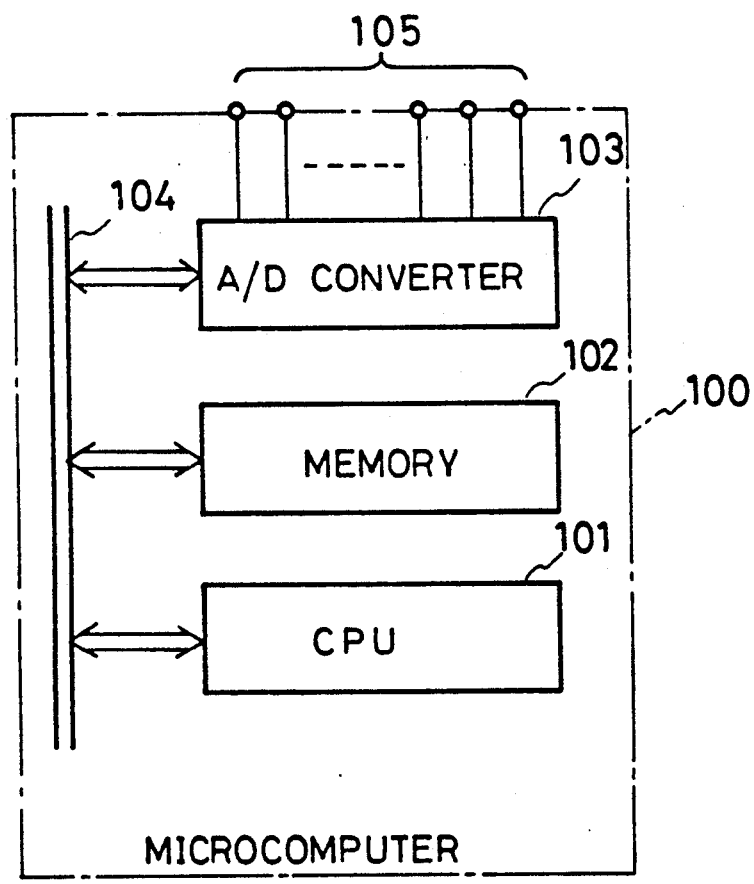
FIG. 3 is a schematic diagram of a microcomputer comprising the A/D converter.
Figure 4:
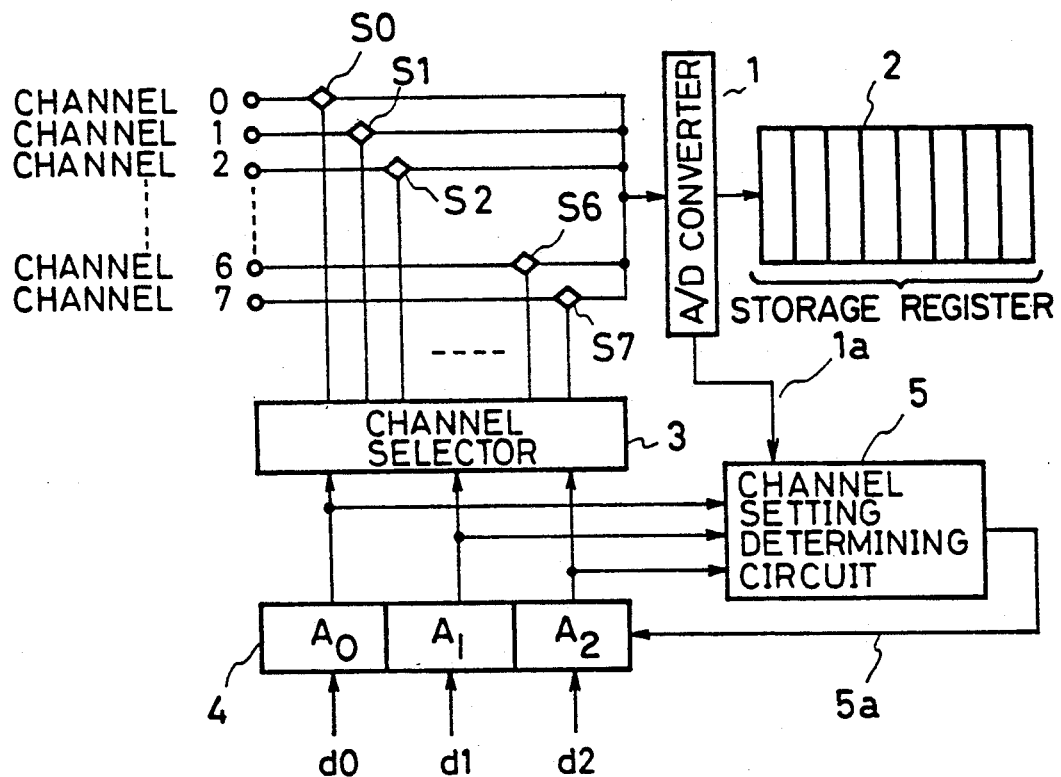
FIG. 4 is a block diagram showing a conventional example of an A/D converter.

FIG. 2 is a block diagram showing generating device of the setting channel conversion completion signal 5b and the like in the channel setting determining circuit 5. In the Figure, numeral 5c indicates a first conversion completion signal selection circuit for outputting an A/D conversion completion signal 1a at the time where a sweep setting channel coincidence signal 5d is active, as a channel setting bit initialization signal 5a. The sweep setting channel coincidence signal 5d is a signal which becomes active when an output of a sweep setting channel which is set previously and an output of the channel setting register 4 coincides to each other. Those are the same as the conventional example. Numeral 5e indicates a flip-flop which is set when the channel setting signal (1) 6b becomes active and its output becomes active, and is reset by the A/D conversion completion signal 1a. Numeral 5f indicates a second conversion completion signal selection circuit for outputting the conversion completion signal 1a, at the time when the output of the flip-flop 5e is active, as a set channel conversion completion signal 5b. The flip-flop 5e and the second conversion completion signal selection circuit 5f construct detecting means 5g of the present invention.

The operation and working of the above-mentioned embodiment will be explained hereinafter.

Assuming that the channels 0 to 3 are selected as sweeping mode, conversions of the channels begin from channel 0 succeeding to channel 3. When those conversions end, the same conversions are repeated starting from the channel 0 through channel 3. That is, at start, channel setting bit of the channel setting register 4 designates the channel 0, the channel selector 3 turns on the switch S0 so as to connect to the A/D converter 1, so that the channel 0 is converted. When the conversion of the channel 0 is completed, a converted result is stored in the conversion result storing register 2 corresponding to the channel. When the conversion is completed by storing the converted result, the channel setting register 4 automatically sets ensuing channel 1, the channel selector 3 turns on the switch S1 so as to connect the channel 1 to the A/D converter 1, so that the channel 1 is converted. The channels 2 and 3 will be converted in the same manner. When the conversions are completed from the channel 0 through 3, the channel setting bit initialization signal 5a is generated from the channel setting determining circuit 5 and the channel setting bit is returned to the channel 0, so that the A/D conversion is repeated starting from the channel 0.

When a conversion of a channel which is not selected as a sweeping channel during the conversion in such a sweeping mode, for example, when channel 6 is to be converted, a channel setting bit of the channel setting register 4 is set so as to designate the channel 6. To this end, in the first place, the channel setting bit of the channel setting register 4, which had set channels under sweeping operation, is saved in the sweep channel saving register 16 by turning on the switches 13, 14, and 15 with the channel setting signal (1) 6b. Immediately after this, d0, d1, and d2 are made to be setting data, and the switches 7, 8, and 9 are turned on by the channel setting signal (0) 6a, so as to set in the channel setting register 4. At this time, the switches 10, 11, and 12 are in a state being turned off. Thus, when the channel 6 which had not been selected as a sweep channel during sweeping operation is set, conversion of a channel under conversion in the sweeping mode is temporarily interrupted, and the channel selector 3 turns on the switch S6, so that an input analog signal of the channel 6 is connected to the A/D converter 1. When the conversion is completed, its result is stored in the converted result storing register 2 corresponding to the channel 6. At the time when the storing is over and its conversion is completed, the setting channel conversion completion signal 5b is generated from the channel setting determining circuit 5. As a result, the switches 10, 11, and 12 are turned on, and the channel set value which had been saved temporarily and under conversion operation in the sweeping mode is returned from the sweeping channel saving register 16 to the channel setting register 4. Upon this returning, the channel which had been interrupted its conversion is selected by the channel selector 3, so that the conversion is restarted by the A/D conversion 1 so as to continue the operation for the sweep mode. Accordingly, when the sweep mode is restored, it is not necessary to begin from the channel at starting, so that the converted result which had been completed in the sweep mode can be utilized effectively.

In the above-mentioned embodiment, although 8 channels are provided as A/D input channel, number of channels is not limited to 8 channels. Number of bits of the channel setting registers 4 and number of register of the converted result storing register 2 may be changed depending on the number of channels.

Also, a starting channel in the sweep mode is not limited to channel 0, but it can be started from any channel by setting a channel setting bit.

In addition, in the above-mentioned embodiment, the conversion of a channel which had not been selected as a sweeping channel during the sweep mode is explained. However, the same operation is also possible in case that an urgent conversion is required for the channel which had been selected as a sweeping channel, by setting a channel in the same manner.

Further, in the above-mentioned embodiment, although explanation is made on an A/D converter built in a microcomputer, application of the present invention is not restricted to it. For example, a device constructing only an A/D converter with a semiconductor integrated circuit can be adapted.

According to the present invention, as described above, a channel under conversion in the sweep mode is saved temporarily and an A/D conversion of a channel established midway can be inserted without shifting the sweep mode to another mode. In addition, after the conversion of the inserted channel is completed, the conversion can re-start from the temporarily saved channel and the sweeping operation can be continued by returning to the original sweep mode, so that all A/D conversion input channels can be utilized effectively without shifting the mode as occasion demands. Further, since the data of converted result completed before the temporary interruption of the sweep mode can be utilized effectively without being collapsed, useless conversion operation can be avoided.

What is claimed is:

1. An A/D converter apparatus for performing A/D conversions using an A/D circuit, the conversions performed on signals carried in a predetermined range of channels selected from among a plurality of analog input channels, each one of the plurality of analog input channels being selected by a channel setting means for conversion based on a channel value stored in a channel register, the channel register characterized by a bit width equal to a predetermined number, and the channel value being modifiable by the channel setting means which varies the channel value sequentially through a range of channel values corresponding to the range of channels, comprising:

a saving register, for saving the contents of the channel register, said saving register characterized by a number of bits equal to the predetermined number of bits;

detecting means, coupled to the A/D converter, for outputting a conversion completion signal upon detection of completion of a conversion by the A/D converter of a signal carried in the channel selected by the channel setting means; and a plurality of saving switches comprising a number of switches equal to the predetermined number, coupled to said saving register and the channel register, for transferring said contents of the channel register to said saving register in response to an interrupt signal;

a plurality of returning switches, comprising a number of switches equal to the predetermined number, coupled to the channel register, said saving register, and said detecting means, for transferring contents of said saving register to the channel register in response to said conversion completion signal output by said detecting means.

* * * * *